(12) United States Patent
Rajguru

(10) Patent No.: US 6,937,948 B2
(45) Date of Patent: Aug. 30, 2005

(54) FLASH MEMORY PROGRAM AND ERASE OPERATIONS

(75) Inventor: Chaitanya S. Rajguru, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 09/993,336

(22) Filed: Nov. 13, 2001

(65) Prior Publication Data

US 2003/0093233 A1 May 15, 2003

(51) Int. Cl.$^7$ .............................................. G06F 19/00
(52) U.S. Cl. ...................... 702/65; 702/136; 702/183; 702/189; 257/213; 257/299; 327/146; 327/147; 365/185.33
(58) Field of Search .............................. 702/57, 64, 65, 702/130, 132, 136, 183, 189, FOR 103, 104, 106, 134, 135, 155, 156, 160, 170; 365/185.33, 185.29, 185.01, 185.18; 327/146, 147, 148, 100, 141; 257/213, 299, 300

(56) References Cited

U.S. PATENT DOCUMENTS 5,978,275 A * 11/1999 Song et al. ............. 365/185.29
6,111,787 A * 8/2000 Akaogi et al. ......... 365/185.11
6,381,670 B1 * 4/2002 Lee et al. .................... 711/103

OTHER PUBLICATIONS

Lin et al., A New 4 Phase Charge Pump Without Body Effects For Low Supply Voltages, Jan. 1994, NCHU, pp. 1–4.*

Kawahara et al., Internal Voltage Generator for Low Voltage Quarter–Micrometer Flash Memories, Jan. 1998, IEEE, vol.: 33, pp. 126–132.*

Tanzawa et al., A Stable Programming Pulse Generator for Single Power Supply Flash Memories, Jun. 1997, IEEE, vol.: 32, pp. 845–851.*

* cited by examiner

*Primary Examiner*—Hal Wachsman
*Assistant Examiner*—Elias Desta
(74) *Attorney, Agent, or Firm*—Fish & Richardson P.C.

(57) ABSTRACT

A flash memory device includes a charge pump having a capacity that is preset to a particular value. The flash memory device includes a measuring circuit to measure the actual capacity of the charge pump and to reset the capacity of the charge pump to a value based on the measured capacity.

19 Claims, 4 Drawing Sheets

TABLE: VOLTAGE FOR PROCESSING FLASH DEVICE

|  | $V_g$ | $V_d$ | $V_s$ |
|---|---|---|---|
| PROGRAM | 10 | 6 | 0 |
| ERASE | -10 | 0 | FLOAT |
| READ | 5 | 1 | 0 |

FLASH MEMORY PROGRAM AND ERASE OPERATIONS

BACKGROUND

This invention relates to flash memory program and erase operations.

There has been a recent trend toward increasing the speed of flash memory devices such as flash electrically erasable programmable read only memory (flash EEPROM) devices that are used in portable computers and other devices. Flash memory devices contain an array of memory cells which are utilized to store data. These devices contain charge pump circuitry for converting an input voltage to a high output voltage and current necessary for programming and erasing the data in the memory cells. The output voltage and current determine the output capacity of the charge pump.

One problem encountered during the process of manufacturing the charge pump circuitry is that the actual output capacity of the charge pump may vary from the optimal output capacity. Often, charge pumps that are produced lack sufficient output capacity to program and erase the memory cells. This results in an undesirable increase in the time to program and erase the cells and a decrease in throughput. Charge pumps also may produce excessive output capacity resulting in an increase in power consumption. Furthermore, once the flash memory devices are placed in an electronic device such as a portable computer, variations in input voltage and in temperature also may cause the output capacity of the charge pump to decrease or increase.

DETAILED DESCRIPTION

Figure 1:
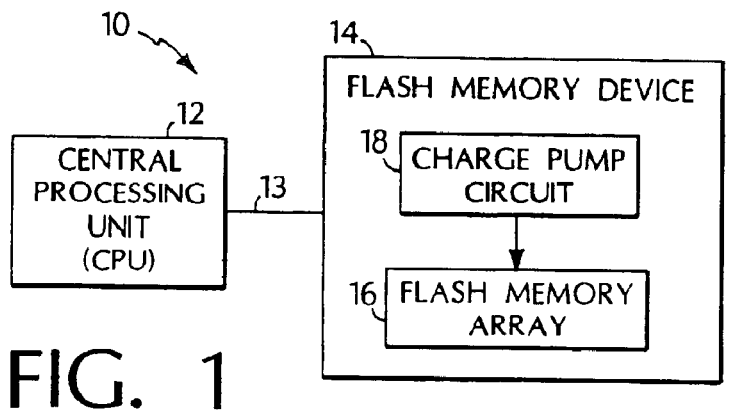
FIG. 1 is a block diagram illustrating a computer system.

As shown in FIG. 1, a computer system 10 includes a central processing unit (CPU) 12 that is coupled to one or more flash memory devices, such as flash memory device 14, over a computer bus 13. The CPU 12 accesses data and programs that are stored in the flash memory device 14 to carry out the various operations of the computer system 10.

The flash memory device 14 includes a flash memory array 16 which contains an array of flash memory cells. A charge pump circuit 18 can be used to program and erase data in each flash memory cell. The charge pump circuit 18 can be powered by a low input voltage source. This voltage source is converted by the charge pump circuit 18 to a higher output voltage source which then is used to program and erase the memory cells in the flash memory array 16. Variations in temperature and input voltage could potentially impact the operation of the charge pump circuit 18 including the time needed to program the flash memory array 16. Techniques for compensating for such variations are discussed below.

Figure 2:
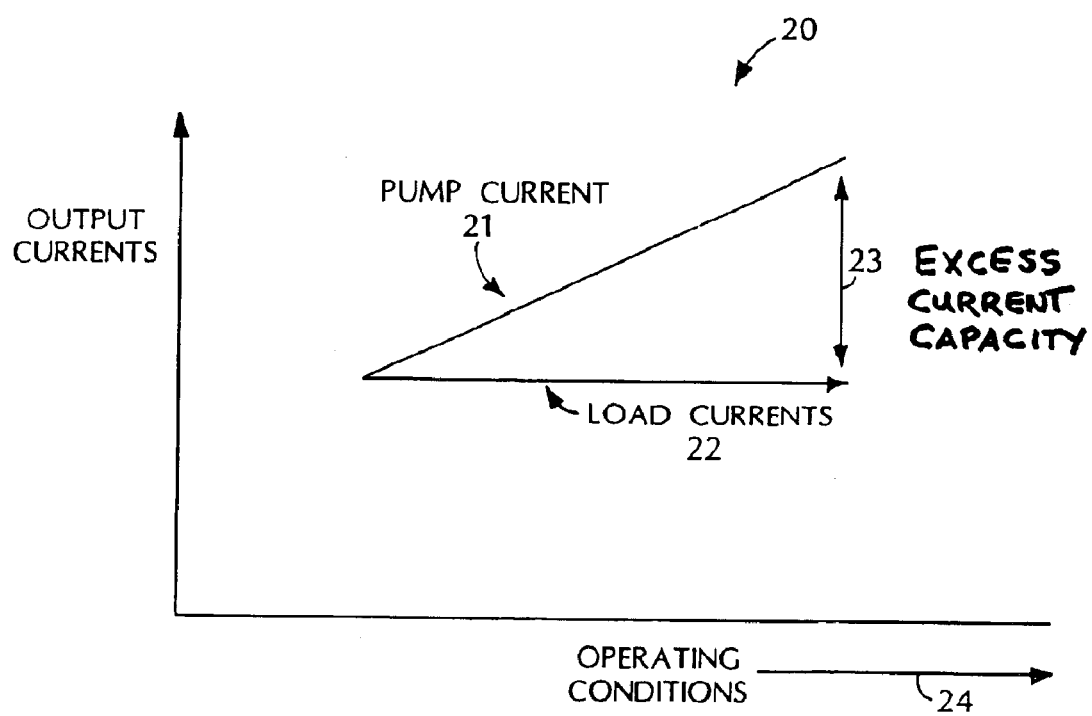
FIG. 2 is a graph showing the output capacity of a charge pump circuit.

FIG. 2 is a graph 20 showing the output capacity of a charge pump circuit. The horizontal axis represents the operating conditions of the charge pump circuit, and the vertical axis represents the output capacity in terms of electrical current that a charge pump circuit can produce. The load current line 22 represents current that the flash memory array 16 requires during the programming and erasing process, and the pump current line 21 represents the current that the pump charge circuit 18 is capable of producing. An increase in operating conditions, as shown by the arrow 24, can cause an increase in memory array processing such as faster programming and/or erasing periods. Such operating conditions include, for example, a reduction in temperature at the charge pump circuit, an increase in input voltage to the pump circuit, as well as other operating conditions. Can also include "fast" circuits as a result of normal variations during the manufacturing process.

As the operating conditions increase, the magnitude of the pump current 21 increases at a rate greater than the rate of the load current 22. As a result, excess current capacity (represented by reference number 23) is available at the charge pump circuit. As discussed below, the excess current capacity can be used to increase the speed of programming and erasing the memory cells to provide an increase in data throughput.

Figure 3A:
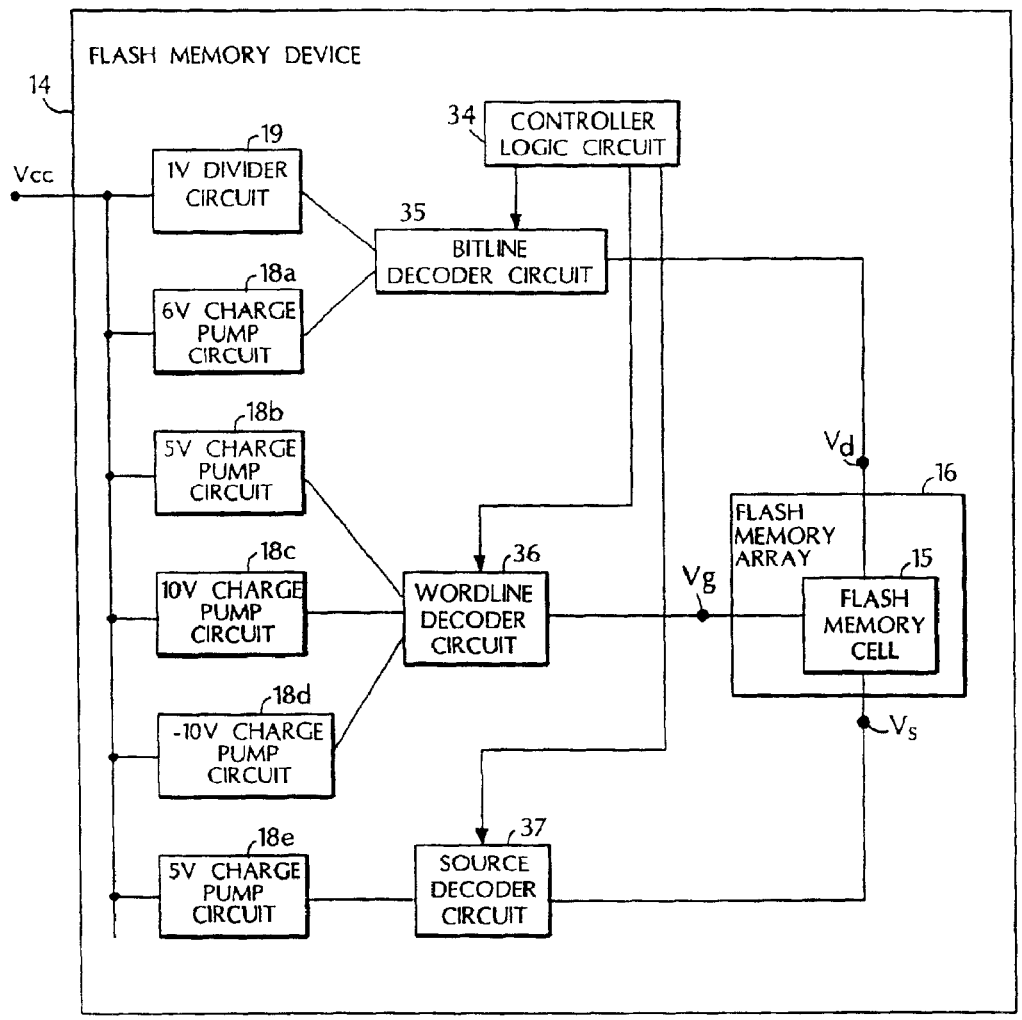
FIG. 3A is a block diagram of a flash memory device.

As shown in FIG. 3A, the flash memory device 14 includes a controller logic circuit 34 containing logic and instructions for controlling the operation of the flash memory device. Such operations include programming and erasing an array of flash memory cells 15 associated with the flash memory array 16. Although only one flash memory cell 15 is shown, the flash memory array 16 typically includes multiple flash memory cells. Each memory cell 15 can be implemented, for example, as a floating gate field effect transistor. In addition, each flash memory cell 15 can be programmed and erased by applying signals with different voltage levels to a gate terminal Vg, a source terminal Vs, and a drain terminal Vd of the flash memory cell.

A group of flash memory cells 15 can be organized into a memory segment having a particular length such as eight, sixteen or thirty-two memory cells. The memory cells 15 can be addressed or referenced either as a whole segment or individually at a bit level within each memory segment. The controller logic circuit 34 uses one or more decoder circuits to address a particular flash memory cell or groups of flash memory cells. For example, a bitline decoder circuit 35 can be used to address a particular memory bit within a memory segment by applying a voltage to the drain terminal Vd of a group of memory cells within the memory segment. Similarly, a wordline decoder circuit 36 can be used to address a particular memory segment in the flash memory cell by applying a voltage to the gate terminal Vg. A source decoder circuit 37 can be used to address the source terminal Vd of each memory cell.

The flash memory device 14 includes one or more charge pump circuits which are used to provide the voltages and currents for programming and erasing the flash memory cells 15. A charge pump is powered by an input voltage Vcc and can be converted to a higher voltage using conventional techniques. For example, a 6-volt charge pump circuit 18a is powered by an input voltage Vcc of 1.8 volts which it converts to an output voltage of 6 volts. There also may be a need to have a voltage signal that is lower than the input voltage Vcc. For example, a 1-volt divider circuit 19 can be used to convert the 1.8 volt input voltage Vcc to an output voltage of 1 volt. The output from the 1-volt divider circuit 19 and the 6-volt charge pump circuit 18a are used by the bitline decoder circuit 35 to provide the necessary voltages and currents to the drain terminal Vd of each flash memory cell 15.

The wordline decoder circuit 36 selects the outputs from one or more charge pumps such as a 5-volt charge pump circuit 18b, a 10-volt charge pump circuit 18c and a −10-volt charge pump circuit 18d to supply voltages and currents to the gate terminal Vg of the flash memory cells 15. The source decoder circuit 37 takes the output from a 5-volt charge pump circuit 18e and applies it to the source terminal Vs of the flash memory cells 15.

Figures 3B, 4:
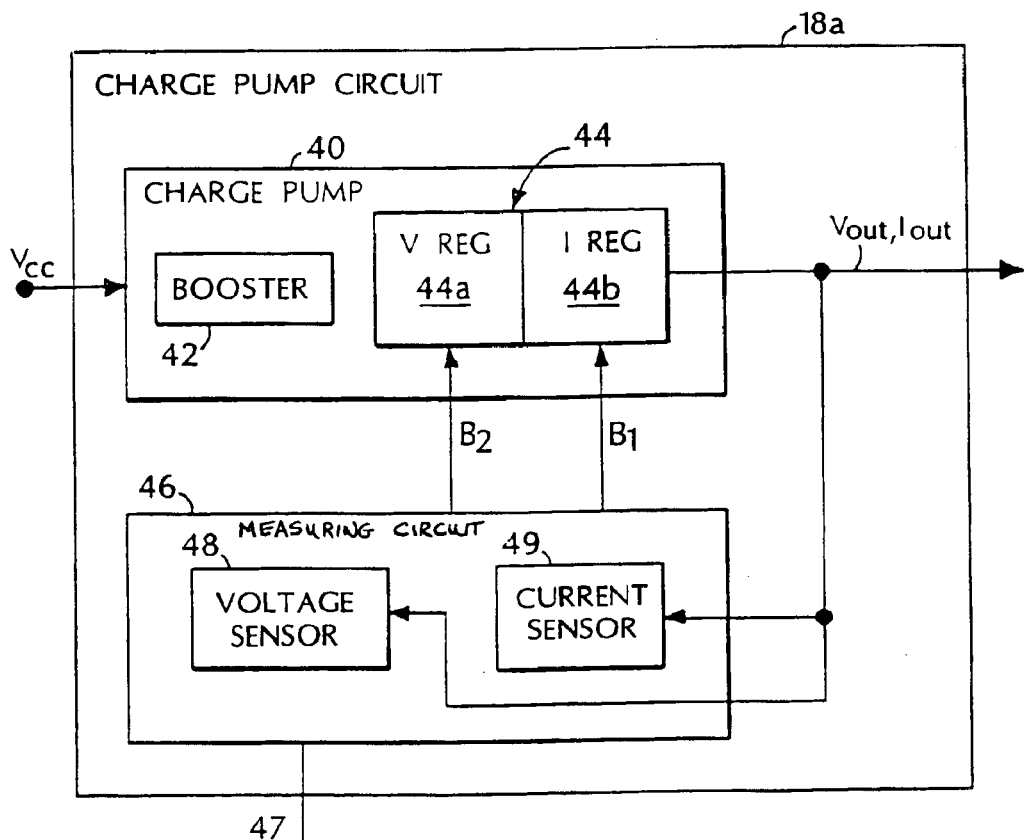
FIG. 3B is a table listing examples of voltages for programming, erasing, and reading a flash memory device.
FIG. 4 is a block diagram of a charge pump circuit.

FIG. 3B shows a table 40 listing examples of voltages to program, erase and read the flash memory cells 15 in the flash memory array 16. To program the flash memory cells 15 in the illustrated implementation, the voltage level at the gate terminal Vg must be about 10 volts, the voltage at the drain terminal Vd must be about 6 volts, and the voltage level at the source terminal Vs has to be about 0 volts. The controller logic circuit 34 is responsible for selecting the appropriate charge pump circuit associated with each decoder circuit. For example, in the programming process discussed above, the control logic circuit 34 provides six volts at the drain terminal Vd by selecting the 6-volt pump circuit 18a through the bitline decoder circuit 35. Likewise, the wordline decoder circuit 36 is used to select the appropriate charge pump circuit to apply the necessary voltages to the gate terminal Vg, and the source decoder circuit 37 is used to select the appropriate charge pump circuit to apply the necessary voltages to the source terminal Vs. Thus, one or more charge pump circuits with different output capacities can be used to program, erase and read the data in the flash memory array 16.

FIG. 4 illustrates further details of the charge pump circuit 18a. The charge pump circuit 18a, as discussed above, is used to provide the voltages and currents to the drain terminal Vd of each flash memory cell 15 during the programming process. The techniques discussed below in connection with the charge pump circuit 18a also are applicable to the other charge pump circuits shown in FIG. 3A.

The charge pump circuit 18a includes a charge pump 40 to convert an input voltage Vcc of 1.8 volts to an output voltage (Vout) that is higher than the input voltage Vcc. The charge pump 40 uses a booster 42 to boost the input voltage Vcc to a higher voltage level. The booster stage can include a series of capacitors driven by a clock signal from an internal voltage controlled oscillator (VCO).

The higher level voltage is fed to a regulator circuit 44 which contains a voltage regulator portion 44a and a current regulator portion 44b. In one implementation, the voltage regulator circuit 44 includes a voltage comparator with a first input fed by the output of the booster 42 and a second input fed by a constant reference voltage. The regulator circuit 44 regulates the output capacity of the charge pump 40 including an output voltage (Vout) and an output current (Iout). The output voltage Vout and the output current Iout can be adjusted by a measuring circuit 46 through signal lines B1 and B2.

By using a constant current method, the measuring circuit 46 can characterize the capacity of the charge pump 40 by measuring the output voltage Vout while the output current Iout is maintained at a constant level. The measuring circuit 46 uses a voltage sensor 48 to measure the voltage level of the output voltage Vout. It then sends to the voltage regulator portion 44a of the regulator circuit 44 a signal on line B2 based on the measured voltage.

The signal on line B2 is used by the voltage regulator portion 44a to control the level of the output voltage Vout. For example, the charge pump circuit 18a can be preset to generate an output voltage Vout of six volts and an output current Iout of two milliamps. If the results of the measurement indicate that the output voltage Vout is greater than the preset value of 6 volt, the measuring circuit 46 sends a signal having logical high value of '1' over line B2. That causes the voltage regulator portion 44a to increase the output voltage Vout to seven volts and to maintain the output current Iout at two milliamps. If the results of the measurement indicate that the output voltage Vout is equal to the preset value of six volts, it sends a signal having a logical low value of '0' over line B2. In that case, the voltage regulator portion 44a maintains the output voltage Vout at six volts and the output current Iout at two milliamps.

In a similar fashion, by using a constant voltage method, the measuring circuit 46 also is capable of measuring the capacity of the charge pump 40 by measuring the output current Iout while the output voltage Vout is kept constant. The measuring circuit 46 uses a current sensor 49 to measure the current level at the output current Iout. In this case, however, the measuring circuit 46 sends a signal over line B1 to the current regulator portion 44b of the regulator circuit 44. The value of the signal sent over line B1 is based on the measured current and is used by the regulator circuit 44 to control the level of the output current Iout.

For example, as discussed above, the charge pump circuit 18a can be preset to generate an output voltage of six volts at an output current of two milliamps. If the results of the measurement indicate that the output current Iout is greater than the preset value of two milliamps, the measuring circuit 46 can send a signal of logical high value of '1' over the line B1. In response, the current regulator portion 44b can increase the output current Iout to three milliamps but maintain the output voltage Vout at six volts. If the results of the measurement indicate that the output current Iout is equal to the preset value of two milliamps, the measuring circuit 46 can send a signal over the line B1 having a logical low value '0'. The current regulator portion 44b maintains the output current Iout at two milliamps and the output voltage Vout at six volts.

The measuring circuit 46 can conduct the capacity measurements during manufacturing of the fast memory device 14. Access line 47 provides external access to the capacity measurements which can be integrated by external manufacturing equipment. The external manufacturing equipment then can determine the actual charge pump capacity and reset the capacity to the appropriate setting. Such capacity measurements include, for example, the "fast" or "slow" pump circuit condition, the voltage level of the input voltage Vcc or the temperature in close proximity to the charge pump. The signals that are sent over the lines B1 and B2 can be designed to cause the regulator circuit 44 to permanently set the output voltage Vout and the output current Iout to predetermined values based on the levels measured by the measuring circuit 46. The signals sent over the lines B1 and B2 can be binary in nature so that a logical '1' can be represented by a high voltage level such as 1.8 volts while a logical '0' can be represented by a low voltage level such as zero volts.

Figure 5:
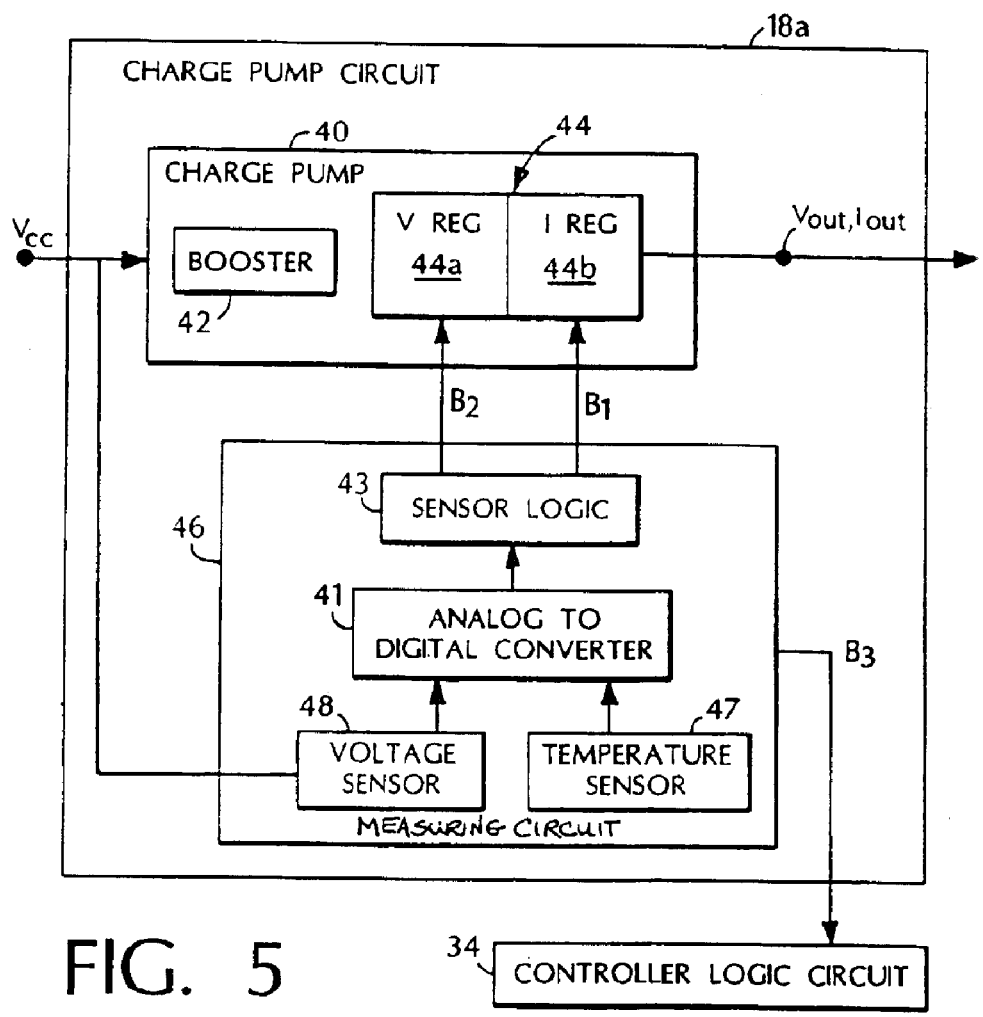
FIG. 5 is a block diagram of a charge pump circuit.

As illustrated in FIG. 5, the charge pump circuits, such as charge pump circuit 18a, can be used to provide the voltages and currents for programming and erasing the flash memory cells 15 in the memory array 16. Many of the elements of the charge pump discussed above in connection with FIG. 4, such as the structure and the function of the charge pump 40, remain the same. However, one difference in this embodiment is the presence of a temperature sensor 47 in the measurement circuit 46.

The temperature sensor 47 is used to measure the temperature of the charge pump circuit 18a or the charge pump

40. It can be placed within the charge pump circuit 18a where it can measure the internal temperature or it can be placed externally where it can measure the external temperature of the charge pump circuit 18a. Internal placement refers to the placement of the sensor 47 inside of an integrated circuit that houses the charge pump circuit 18a, whereas external placement refers to the placement of the sensor outside of the integrated circuit. The temperature sensor 47 can be a conventional sensor with an operating range that matches the operating temperature range of the flash device such as −40° C. to 85° C.

An output analog signal representing the value of the measured temperature is sent to an analog-to-digital (A/D) converter 41. The A/D converter 41 generates a digital signal representing the analog value of the measured temperature. In one implementation, the A/D converter 41 can be a conventional converter that is calibrated to accept signals in the range of the voltage source Vcc and the output level of the temperature sensor 47.

The measuring circuit 46 measures the capacity of the charge pump 40 by measuring the input voltage Vcc using a voltage sensor 48. An output analog signal representing the value of the measured voltage is sent to the A/D converter 41. The A/D converter 41 converts the analog signal to a digital signal representing the analog value of the measured voltage.

A sensor logic circuit 43 processes the digital signals from the A/D converter 41. The sensor logic circuit 43 can contain digital logic configured to make decisions based on the values of the digital signals which represent the measured values of the temperature and the input voltage Vcc. The sensor logic circuit 43 sends a signal over a line B2 to the voltage regulator portion 44a of the regulator circuit 44. It also sends a signal over line B1 to the current regulator portion 44b of the regulator circuit 44. The value of the signals over lines B1 and B2 are based on the values of the measured voltage and temperature. In addition, line B3 is used to send a signal to the controller logic circuit 34 to allow the circuit to recognize the results of the measurement and take appropriate action.

For example, the charge pump circuit 18a is powered by an input voltage Vcc of 1.8 volts and is preset to generate an output voltage Vout of six volts at an output current Iout of two milliamps. If the results of the temperature measurement indicate that the temperature is less than 25° C. and the input voltage Vcc measurement indicate that the voltage is greater than 1.8 volts, then a logical high value of '1' is sent over line B1, a logical low value of '0' is sent over line B2, and a logical high value of '1' is sent over B3. As a result, the voltage regulator portion 44a increases the output voltage Vout from six volts to seven volts but maintains the output current Iout at two milliamps. In addition, the signal over line B3 enables the controller logic circuit 34 to recognize this condition and take appropriate action.

On the other hand, if the results of the measurement indicate that either the input voltage Vcc is less than 1.8 volts or the temperature is greater than 25° C., then a logical low value of '0' is sent over lines B1, B2 and B3. This causes the voltage regulator portion 44a to maintain the output voltage Vout at six volts and the output current Iout at two milliamps.

The measurements conducted in this embodiment can be taken while the circuit is operating within a computer system such as a cellular phone or a portable computer. This has the advantage of allowing the capacity of a charge pump circuit to be adjusted dynamically based on real time operating conditions. Microcode (instructions) within the controller logic circuit 34 can be modified to allow the charge pump 18a to dynamically respond to the changes in operating conditions.

Figure 6:
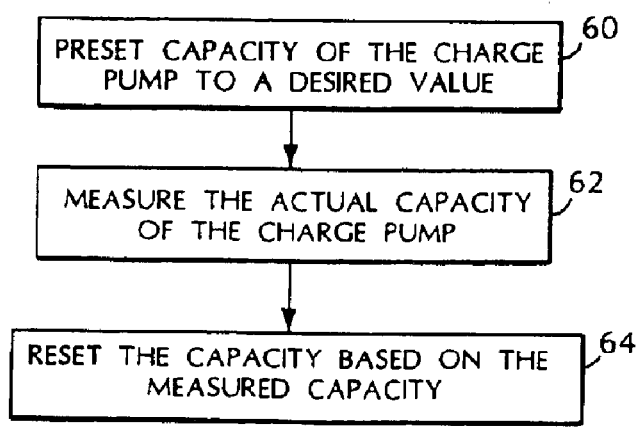
FIG. 6 is a simplified flow chart illustrating a method of practicing the invention.

FIG. 6 illustrates operation of the charge pumps, such as the charge pump 18a. The capacity of a charge pump can be preset at 60 to a desired value. In a flash memory device 14 that contains multiple charge pump circuits, the capacity of each charge pump can be preset to respective predetermined values during the design and manufacturing process. The predetermined values can include a preset output current Iout and a preset output voltage Vout.

Once the capacity of the charge pump has been preset to desired values, the actual capacity of the charge pump is measured at 62. As discussed above, a measuring circuit can be used to measure the actual capacity by measuring variations in operating conditions or capacity such as variations in input voltage (Vcc), output voltage (Vout) and output current (Iout), temperature, "fast" or "slow" circuit condition and other operating conditions. These conditions can be measured using a constant current or constant voltage technique.

Once the actual capacity of the charge pump has been measured, the capacity of the charge pump can be reset at 64 based on the measured capacity. In one embodiment discussed above, the actual capacity can be measured during the manufacturing process to allow the capacity of the charge pump to be reset permanently based on the actual capacity. In another embodiment, the capacity can be measured while the charge pump circuit is operating in a computer system to permit the capacity to be continuously and dynamically adjusted to real time operating conditions.

The foregoing techniques can improve the data programming and erasing throughput in flash memory devices such as flash EEPROM devices. Products that use flash memory devices are becoming increasingly popular for storing data. As a result, the memory size densities of these devices have increased causing the programming and erasing times to increase. By using the techniques discussed above, the time to program and erase the devices can be reduced to allow higher memory size density devices to be deployed in a cost efficient manner. In addition, electronic devices or components that include charge pumps such as voltage regulators can use the techniques.

By using the foregoing techniques, power consumption can be reduced in flash memory devices. Battery operated computing devices that use flash memory devices such as cellular phones, personal digital assistants (PDAs) and portable computers can benefit from such a reduction in power consumption. Moreover, the amount of flash memory storage can be increased to take advantage of the extra battery operating capacity that is made available.

Various modifications may be made to the foregoing ID embodiments. For example, the output voltage (Vout) can be adjusted by amounts other than 1-volt increments and/or the output current (Iout) can be adjusted by amounts other than 1milliamp incrememts. Other implements are within the scope of the following claims.

What is claimed is:

1. An apparatus comprising:
    a charge pump having a capacity that is preset to a particular value to simultaneously affect a first number of flash memory cells at a particular voltage; and
    a measuring circuit including a voltage sensor to sense a voltage at an input and output of the charge pump and a temperature sensor to measure the temperature of the charge pump, wherein the measuring circuit is configured to measure an actual capacity of the charge pump and to reset the capacity of the charge pump to a second value based on the measure capacity to simultaneously affect a second number of flash memory cells.

2. The apparatus of claim 1 wherein an output of the charge pump is preset to operate at particular voltage and current levels.

3. The apparatus of claim 1 wherein the measuring circuit includes a current sensor to sense a current at an output of the charge pump.

4. An apparatus comprising:
 an array of memory cells; and
 a charge pump circuit coupled to the array of memory cells to drive the array of memory cells, the charge pump circuit comprising:
  a charge pump having a capacity that is preset to a particular value to simultaneously affect a first number of flash memory cells at a particular voltage; and
  a measuring circuit including a voltage sensor to sense a voltage at an input and output of the charge pump and a temperature sensor to measure the temperature of the charge pump, wherein the measuring circuit is configured to measure an actual capacity of the charge pump and to reset the capacity of the charge pump to a second value based on the measured capacity to simultaneously affect a second number of flash memory cells.

5. The apparatus of claim 4 wherein an output of the charge pump is preset to operate at particular voltage and current levels.

6. The apparatus of claim 4 wherein the measuring circuit includes a current sensor to sense a current at an output of the charge pump.

7. A computer system comprising:
 a central processor; and
 a memory coupled to the central processor, the memory comprising:
  an array of memory cells, and
  a charge pump circuit coupled to the array of memory cells to drive the array of memory cells, the charge pump circuit comprising:
   a charge pump having a capacity that is preset to a particular value to simultaneously affect a first number of flash memory cells at a particular voltage, and
   a measuring circuit including a voltage sensor to sense a voltage at an input and output of the charge pump and a temperature sensor to measure the temperature of the charge pump, wherein the measuring circuit is configured to measure an actual capacity of the charge pump and to reset the capacity of the charge pump to a second value based on the measured capacitity to simultaneously affect a second number of flash memory cells.

8. The computer system of claim 7 wherein an output of the charge pump is preset to operate at particular voltage and current levels.

9. The computer system of claim 7 wherein the measuring circuit includes a current sensor to sense the current at an input of the charge pump.

10. A method comprising:
 establishing a nominal value for a capacity of a charge pump sufficient to simultaneously affect a first number of flash memory cells at a particular voltage;
 characterizing an actual capacity of the charge pump by measuring an output voltage level of the charge pump while an output current of the charge pump is kept at a constant value; and
 resetting the nominal capacity value of the charge pump to a second capacity value based on the actual capacity, wherein the second capacity value of the charge pump is sufficient to simultaneously affect a second number of flash memory cells.

11. The method of claim 10, wherein the second capacity value is reset by resetting the output value of the charge pump.

12. The method of claim 10, wherein the second number of flash memory cells is greater than the first number of memory cells.

13. The method of claim 10, wherein characterizing the charge pump includes a temperature sensor to measure the temperature of the charge pump.

14. A method comprising:
 establishing a nominal value for a capacity of a charge pump sufficient to simultaneously affect a first number of flash memory cells at a particular current;
 characterizing an actual capacity of the charge pump by measuring an output current level of the charge pump while an output voltage of the charge pump is kept at a constant value; and
 resetting the nominal capacity value of the charge pump to a second capacity value based on the actual capacity, wherein the second capacity value of the charge pump is sufficient to simultaneously affect a second number of flash memory cells.

15. The method of claim 14, wherein the second capacity value is reset by resetting the output current level of the charge pump.

16. The method of claim 14, wherein the second number of flash memory cells is greater than the first number of memory cells.

17. The method of claim 14, wherein characterizing the charge pump includes a temperature sensor to measure the temperature of the charge pump.

18. The method of claim 14, wherein affecting the flash memory cells comprises at least one of programming, erasing and reading the flash memory cells.

19. A method comprising:
 recognizing a difference between a nominal capacity value of a charge pump sufficient to simultaneously affect a first number of flash memory cells and an actual capacity value sufficient to simultaneously affect a second number of flash memory cells;
 resetting the nominal value to the actual capacity value; and
 using the actual capacity value of the charge pump to simultaneously affect the second number of flash memory cells,
 wherein the second number of flash memory cells is greater than the first number of flash memory cells.

* * * * *